United States Patent
Nangoy et al.

(10) Patent No.: US 9,488,315 B2
(45) Date of Patent: Nov. 8, 2016

(54) GAS DISTRIBUTION APPARATUS FOR DIRECTIONAL AND PROPORTIONAL DELIVERY OF PROCESS GAS TO A PROCESS CHAMBER

(71) Applicant: APPLIED MATERIALS, INC., Santa Clara, CA (US)

(72) Inventors: Roy C. Nangoy, Santa Clara, CA (US); Saravjeet Singh, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 116 days.

(21) Appl. No.: 14/207,475

(22) Filed: Mar. 12, 2014

(65) Prior Publication Data
US 2014/0261805 A1  Sep. 18, 2014

Related U.S. Application Data

(60) Provisional application No. 61/792,874, filed on Mar. 15, 2013.

(51) Int. Cl.
*F16K 11/20* (2006.01)
*F17D 1/00* (2006.01)

(52) U.S. Cl.
CPC ............ *F17D 1/00* (2013.01); *Y10T 137/8733* (2015.04)

(58) Field of Classification Search
CPC ............... F17D 1/00; Y10T 137/8733; Y10T 137/87249; Y10T 137/85938; Y10T 137/87153; Y10T 137/577; H01J 37/32449; C23C 16/45561
See application file for complete search history.

(56) References Cited

U.S. PATENT DOCUMENTS

| | | | |
|---|---|---|---|
| 7,708,859 B2 | 5/2010 | Huang et al. | |
| 7,846,497 B2 * | 12/2010 | Gold | C23C 16/4412 137/1 |
| 8,088,248 B2 | 1/2012 | Larson | |
| 8,313,611 B2 | 11/2012 | Larson | |
| 8,673,785 B2 | 3/2014 | Huang et al. | |
| 8,772,171 B2 | 7/2014 | Larson | |
| 2005/0028934 A1* | 2/2005 | Miya | H01J 37/3244 156/345.33 |
| 2005/0241763 A1* | 11/2005 | Huang | C23C 16/45561 156/345.33 |
| 2007/0006038 A1* | 1/2007 | Zhou | G06F 11/263 714/38.1 |
| 2008/0078746 A1* | 4/2008 | Masuda | H01J 37/3244 216/79 |
| 2009/0159213 A1* | 6/2009 | Bera | H01J 37/3244 156/345.34 |
| 2009/0272717 A1* | 11/2009 | Pamarthy | H01L 21/30655 216/37 |
| 2012/0227904 A1* | 9/2012 | Akiyoshi | C23C 16/45561 156/345.26 |
| 2013/0000731 A1 | 1/2013 | Singh et al. | |
| 2014/0261733 A1* | 9/2014 | Wu | C23C 16/45561 137/15.04 |
| 2014/0261805 A1 | 9/2014 | Nangoy et al. | |
| 2016/0163873 A1 | 6/2016 | Koezuka et al. | |

OTHER PUBLICATIONS

U.S. Appl. No. 15/044,428, filed Jan. 22, 2016, Rogers.

* cited by examiner

*Primary Examiner* — Jessica Cahill
(74) *Attorney, Agent, or Firm* — Moser Taboada; Alan Taboada

(57) ABSTRACT

In some embodiments, a gas distribution apparatus may include: a manifold having a gas inlet to receive a process gas from a fast gas exchange unit and a first gas outlet to provide the process gas to a first gas delivery zone; a plurality of flow restrictors fluidly coupled to one another in parallel and to the gas inlet, wherein each of the plurality of flow restrictors are configured to allow at least a portion of a total flow of a process gas through each of the plurality of flow restrictors; and a plurality of valves each coupled to respective ones of the plurality of flow restrictors, wherein the plurality of valves are configured to be selectively opened to allow the process gas to flow through selective ones of the plurality of flow restrictors to provide a desired percentage of a total flow of the process gas to the outlet.

18 Claims, 3 Drawing Sheets

GAS DISTRIBUTION APPARATUS FOR DIRECTIONAL AND PROPORTIONAL DELIVERY OF PROCESS GAS TO A PROCESS CHAMBER

CROSS-REFERENCE TO RELATED APPLICATIONS

This application claims benefit of U.S. provisional patent application Ser. No. 61/792,874, filed Mar. 15, 2013, which is herein incorporated by reference.

FIELD

Embodiments of the present invention generally relate to semiconductor substrate processing.

BACKGROUND

The inventors have observed that conventional gas distribution systems utilized in applications that require rapid switching of one or more process gases do not have sufficient flexibility to facilitate some high aspect ratio etch applications, for example such as through silicon via formation applications with adequate efficiency.

Therefore, the inventors have provided improved methods and apparatus for controlling gas flow.

SUMMARY

Embodiments of gas distribution apparatus are provided herein. In some embodiments, a gas distribution apparatus includes a manifold having a gas inlet coupled to the manifold to receive a process gas from a fast gas exchange unit and a first gas outlet to provide the process gas to a first gas delivery zone; a plurality of flow restrictors fluidly coupled to one another in parallel, and fluidly coupled to the gas inlet, wherein each of the plurality of flow restrictors are configured to allow at least a portion of a total flow of a process gas through each of the plurality of flow restrictors; and a plurality of valves each coupled to respective ones of the plurality of flow restrictors, wherein the plurality of valves are configured to be selectively opened to allow the process gas to flow through selective ones of the plurality of flow restrictors to provide a desired percentage of a total flow of the process gas to the outlet.

In some embodiments, a gas distribution system includes a housing having a gas distribution apparatus and a fast gas exchange unit disposed within the housing, the fast gas exchange unit having a plurality of inlets respectively coupled to a plurality of gas sources; an outlet coupled to the inlet of the manifold; a first flow path having a first plurality of flow controllers; and a second flow path having a second plurality of flow controllers, wherein selective actuation of the first plurality of flow controllers and the second plurality of controllers provides a flow of a process gases from one of the plurality of gas sources to the outlet, wherein the gas distribution apparatus comprises: a manifold having a gas inlet coupled to the manifold to receive a process gas from the fast gas exchange unit and a first gas outlet to provide the process gas to a first gas delivery zone; a plurality of flow restrictors fluidly coupled to one another in parallel, and fluidly coupled to the gas inlet, wherein each of the plurality of flow restrictors are configured to allow at least a portion of a total flow of a process gas through each of the plurality of flow restrictors; and a plurality of valves each coupled to respective ones of the plurality of flow restrictors, wherein the plurality of valves are configured to be selectively opened to allow the process gas to flow through selective ones of the plurality of flow restrictors to provide a desired percentage of a total flow of the process gas to the outlet.

In some embodiments, a gas distribution system includes: a housing; a fast gas exchange unit disposed within the housing; and a gas distribution apparatus disposed within the housing. The fast gas exchange unit includes: a plurality of inlets respectively coupled to a plurality of gas sources; an outlet; a first flow path having a first plurality of flow controllers; and a second flow path having a second plurality of flow controllers, wherein selective actuation of the first plurality of flow controllers and the second plurality of controllers provides a flow of a process gases from one of the plurality of gas sources to the outlet. The gas distribution apparatus includes: a manifold having a gas inlet to receive a process gas from the outlet of the fast gas exchange unit and a first gas outlet to provide the process gas to a first gas delivery zone; a plurality of flow restrictors fluidly coupled to one another in parallel, and fluidly coupled to the gas inlet, wherein each of the plurality of flow restrictors are configured to allow at least a portion of a total flow of a process gas through each of the plurality of flow restrictors, wherein the plurality of flow restrictors comprise a first set of flow restrictors fluidly coupled to one another in parallel and fluidly coupled to the first gas outlet, and a second set of flow restrictors fluidly coupled to one another in parallel and fluidly coupled to a second gas outlet to provide the process gas to a second gas delivery zone, and wherein the first gas delivery zone and the second gas delivery zone are gas zones of a process chamber; and a plurality of valves each coupled to respective ones of the plurality of flow restrictors, wherein the plurality of valves are configured to be selectively opened to allow the process gas to flow through selective ones of the plurality of flow restrictors to provide a desired percentage of a total flow of the process gas to the outlet.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
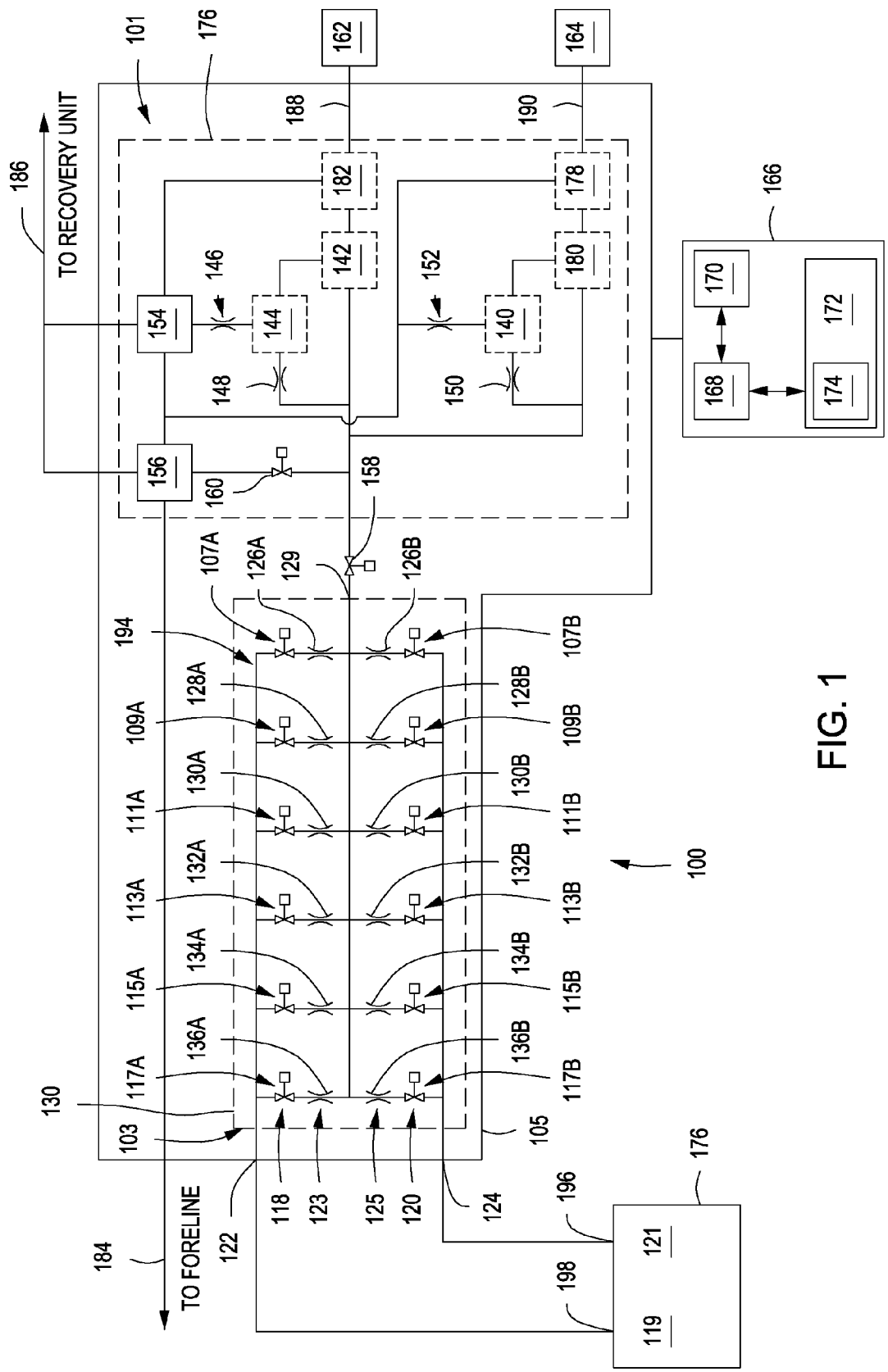
FIG. 1 depicts a gas distribution system having a gas distribution apparatus in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of gas distribution apparatus are provided herein. In at least some embodiments of the present invention, the inventive gas distribution apparatus may advantageously provide for greater flexibility in etching applications by allowing for selectively directing a process gas and/or selectively proportioning a process gas to multiple gas delivery zones.

FIG. 1 depicts a gas distribution system in accordance with some embodiments of the present invention. The gas distribution system 100 generally comprises a fast gas exchange unit 101 and a gas distribution apparatus 103. In some embodiments, the fast gas exchange unit 101 and the gas distribution apparatus 103 may be contained in a housing 105. Alternatively, or in combination, in some embodiments, each of the fast gas exchange unit 101 and the gas distribution apparatus 103 may have a separate housing (shown in phantom at 176 and 130), or may be provided without a housing. In some embodiments, a valve 158 may be disposed between the fast gas exchange unit 101 and the gas distribution apparatus 103 to selectively shut off a flow of process gas from the fast gas exchange unit 101 for safety, or to allow maintenance to be performed on the gas distribution system 100.

The gas distribution apparatus 103 generally comprises a manifold 194 having a gas inlet 129, one or more gas outlets (first gas outlet 122 and second gas outlet 124 shown), a plurality of valves 107A-B-117A-B (collectively 107-117) and a plurality of flow restrictors (orifices) 126A-B-136A-B (collectively 126-136) coupled to respective ones of the plurality of valves 107-117. A first set of orifices 123 may be fluidly coupled to the first gas outlet 122 via a first set of valves 118 and fluidly coupled to one another in parallel. A second set of orifices 125 may be fluidly coupled to the second gas outlet 124 via a second set of valves 120 and fluidly coupled to one another in parallel.

The first gas outlet 122 and second gas outlet 124 are respectively coupled to a first gas inlet 198 and a second gas inlet 196 of a process chamber 176 to provide a flow of process gas to a first gas delivery zone 119 and second gas delivery zone 121, respectively. The first gas delivery zone 119 and the second gas delivery zone 121 may be gas zones of a process chamber (e.g., the process chamber 300 as described below). For example, in some embodiments, the first gas delivery zone 119 may be an area disposed proximate a center of a substrate support disposed within the process chamber and the second gas delivery zone 121 may be an area disposed proximate an edge of the substrate support.

The valves 107-117 allow for selectively providing a flow of process gas to the orifices 126-136. In some embodiments, the valves 107-117 may include pneumatic actuators for pneumatic operation to allow rapid opening and closing of valves 107-117 and provide numerous flow configurations (as described below). In some embodiments, the pneumatic actuators may be coupled to, and controlled and monitored by, for example, a controller 166. The inventors have observed that controlling the valves via an external controller eliminates the need for internal software installed within the gas distribution apparatus 103, thereby eliminating instances of software conflicts with other components of the gas distribution system 100 (e.g., software utilized to control mass flow controllers).

The orifices 126-136 restrict a flow of the process gas to the plurality of valves 107-117 and may each be individually sized to allow a desired flow of process gas through each of the orifices 126-136 to each of the plurality of valves 107-117. For example, each of the orifices 126-136 may be individually sized, having a diameter selected to provide a desired flow rate. Thus, selectively opening individual valves of the plurality of valves 107-117 allows the process gas to flow through selective ones of the orifices 126-136, thereby providing a desired flow of process gas to one or both of the first gas outlet 122 and second gas outlet 124.

In some embodiments, the orifices 126-136 may be sized relative to one another such that a gas flow through a specific number of the orifices 126-136 collectively provide a total desired gas flow (e.g., 100%) of the process gas provided to the manifold 194. For example, in some embodiments, a first orifice 126A-B may allow for about 5% of a total gas flow, a second orifice 128A-B may allow for about 10% of the total gas flow, a third orifice 130A-B may allow for a 20% of the total gas flow, a fourth orifice 132A-B may allow for a 25% of the total gas flow, and fifth orifice 134A-B may allow for a 40% of the total gas flow. Thus, by selectively opening the valves corresponding to each of the orifices 126-136, a gas flow of up to about 100% of the total desired gas flow may be provided.

In addition, in some embodiments, a sixth orifice 136A-B may be sized to allow an equivalent gas flow of the first orifice 126A-B, second orifice 128A-B, third orifice 130A-B, fourth orifice 132A-B, and fifth orifice 134A-B combined (e.g., 100% of the total gas flow). Providing the sixth orifice 136A-B allows for a total gas flow to be provided utilizing only a single valve (e.g., a sixth valve 117A, 117B). In addition, providing the sixth orifice 136A-B ensures that a total gas flow may be provided by the gas distribution apparatus 103 and may accommodate for reductions in gas flows due to, for example, friction caused by bends in the gas lines, junctions, differences of flow conductance between conduits, or the like.

Figure 2:
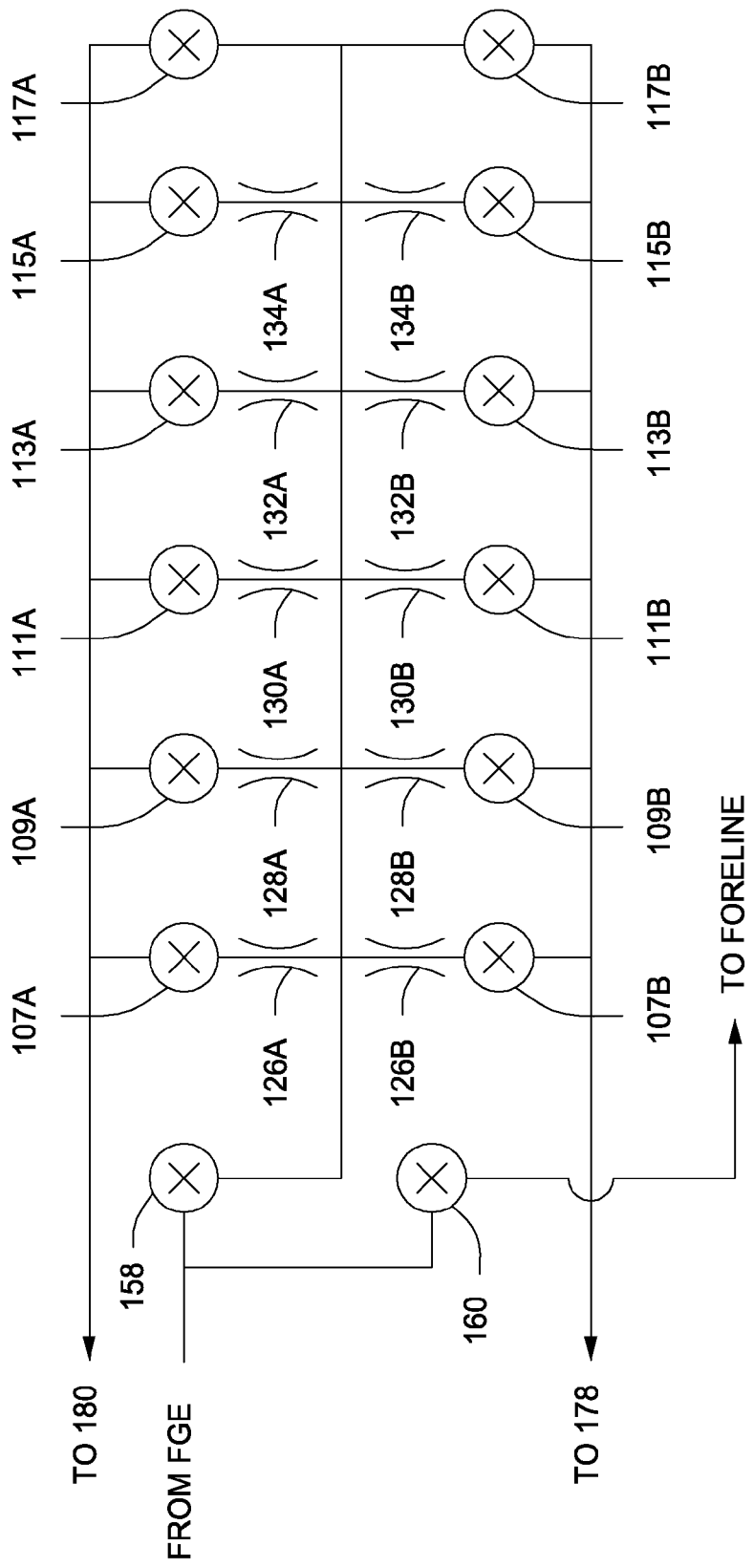
FIG. 2 depicts a gas distribution apparatus in accordance with some embodiments of the present invention.

Referring to FIG. 2, in some embodiments, a sixth orifice 136A-B may not be required if a diameter of a gas line coupling the sixth valve 117A, 117B to the gas outlets 122, 124, is sufficient to provide a total desired gas flow. In addition, the sixth valve 117A, 117B may be disposed furthest from gas outlets, such as shown in FIG. 2.

Referring back to FIG. 1, in operation of the gas distribution apparatus 103 as described above, the gas distribution apparatus 103 receives a process gas from the fast gas exchange unit 101 and selectively provides the process gas to the gas delivery zones 119, 121. In some embodiments, the gas distribution apparatus 103 may allow for selectively directing a total flow of process gas to either or both of the first gas delivery zone 119 or the second gas delivery zone 121, or alternating between the two gas delivery zones 119, 121. For example, to selectively provide a total gas flow of a process gas to the first gas delivery zone 119, only the sixth valve 117A of the first set of valves 118 may be opened to allow the process gas to flow through the sixth flow restrictor 136A to the first gas delivery zone 119, thereby providing a 100% flow of the process gas to the first gas delivery zone 119. To provide the process gas (or alternatively, a different process gas) to the second gas delivery zone 121, the sixth valve 117A of the first set of valves 118 may be closed, and the sixth valve 117B of the second set of valves 120 may be opened to allow the process gas to flow through the sixth flow restrictor 136B, thereby switching the flow of the process gas from the first gas delivery zone 119 to the second gas delivery zone 121. In some embodiments, the switching of delivery of the process gas between the first gas delivery zone 119 and the second gas delivery zone 121 may correspond with cycles of the fast gas exchange unit 101. For example, as the fast gas exchange unit 101 alternately provides a first process gas and a second process gas, the gas distribution apparatus 103 may synchronously alternate providing the first process gas to the first gas delivery zone 119 and the second gas delivery zone 121.

In some embodiments, the gas distribution apparatus 103 may allow for providing a first process gas to both the first gas delivery zone 119 and the second gas delivery zone 121 and a subsequent second process gas to only one of first gas delivery zone 119 or the second gas delivery zone 121. For example, to provide a total gas flow of a first process gas provided by the fast gas exchange unit 101 to both the first gas delivery zone 119 and the second gas delivery zone 121 the sixth valve 117A-B of the first set of valves 118 and the second set of valves 120 may be selectively opened to allow the first process gas to flow through the sixth flow restrictor 136A-B to the first gas delivery zone 119 and second gas delivery zone 121, thereby providing a 100% flow of the first process gas to the first gas delivery zone 119 and the second gas delivery zone 121. A total flow of a second process gas provided by the fast gas exchange unit 101 may then be subsequently selectively provided to the first gas delivery zone 119 by closing the sixth valve 117B of the second set of valves 120 to allow the second process gas to flow through the sixth flow restrictor 136B, thereby providing a 100% flow of the second process gas to only the second gas delivery zone 121.

In some embodiments, the gas distribution apparatus 103 may allow for selectively proportioning a process gas to the first gas delivery zone 119 and the second gas delivery zone 121. For example, to provide a proportional flow of a first process gas provided by the fast gas exchange unit 101 to the first gas delivery zone 119 and the second gas delivery zone 121, a third valve 111A of the first set of valves 118 may be selectively opened and the first valve 107B, second valve 109B, third valve 113B and fourth valve 115B of the second set of valves 120 may be selectively opened, thereby providing the first process gas to the first gas delivery zone 119 and the second gas delivery zone 121 in a ratio of first gas delivery zone 119 to second gas delivery zone 121 of about 1:4.

In some embodiments, the gas distribution apparatus 103 may allow for simultaneously selectively directing a process gas and selectively proportioning a process gas to first gas delivery zone 119 and the second gas delivery zone 121. For example, after selectively proportioning the first process gas to the first gas delivery zone 119 to second gas delivery zone 121 in a 1:4 ratio, as described above, the third valve 111A of the first set of valves 118 and the first valve 107B, second valve 109B, third valve 113B and fourth valve 115B of the second set of valves 120 may be closed and the third valve 111B of the second set of valves 120 and the first valve 107A, second valve 109A, third valve 113A and fourth valve 115A of the first set of valves 118 may be selectively opened to provide the first process gas (or a second process gas provided by the fast gas exchange unit 101 subsequent to the first process gas) to the first gas delivery zone 119 and the second gas delivery zone 121 in a ratio of first gas delivery zone 119 to second gas delivery zone 121 of about 4:1.

The fast gas exchange unit 101 facilitates selectively providing process gases from a plurality of process gas sources (two process gas supplies 162, 164 shown in FIG. 1) to the gas distribution apparatus 103. In addition, the fast gas exchange unit 101 allows for rapid switching of the process gases to facilitate processes that require providing alternating process gases to perform the process. For example, in etching applications used to etch high aspect ratio features (e.g., a height to width ratio of greater than about 4:1 or in some embodiments, 100:1), for example, such as a through silicon through via (TSV) feature, a rapidly alternating flow of deposition gases and etch gases may be provided to a form a feature having a desired depth while maintaining the desired height to width ratio.

The fast gas exchange unit 101 generally includes a plurality of flow paths (first flow path 188 and second flow path 190 shown in FIG. 1) respectively coupled to process gas supplies (process gas supplies 162, 164) each having a plurality of flow controllers (first flow controllers 178, 182, second flow controllers 142, 180, third flow controllers 144, 140 and fourth flow controllers 154, 156 shown in FIG. 1) configured to allow the process gases provided by the process gas supplies 162, 164 to be selectively provided to a foreline 184 to exhaust the process gas, a process gas recovery unit 186 to recycle the process gas or to the gas distribution apparatus 103 for delivery to the process chamber 176. In some embodiments, a valve 160 may be disposed between the plurality of flow paths 188, 190 and the process gas recovery unit 186 and/or foreline 184 to allow the process gas provided by the plurality of flow paths to be selectively shut off for safety, or to allow maintenance to be performed on the gas distribution system 100.

For clarity, a single flow path (first flow path 188) is described below. However, it is to be understood that the remaining flow paths (e.g., second flow path 190 or other flow paths that may be included in the fast gas exchange unit 101) may be configured and operate substantially similar to the described flow path.

The first flow path 188 includes a first flow controller 182, a second flow controller 142, a third flow controller 144, and a fourth flow controller 154 that are in communication with each other to selectively direct process gases to the foreline 184, process gas recovery unit 186 or the gas distribution apparatus 103. In some embodiments, each of the first flow controller 182, second flow controller 142, third flow controller 144 and fourth flow controller 154 may be a three way valve or include a plurality of two way valves to facilitate providing the selective directional flow of the process gases as described above. In some embodiments, the first flow controller 182, second flow controller 142, third flow controller 144 and fourth flow controller 154 may include pneumatic actuators for pneumatic operation to allow rapid switching of process gases (e.g., alternating between providing a first process gas and a second process gas at an interval of less than one second, or in some embodiments, less than about a half second) and provide numerous flow configurations. In some embodiments, the pneumatic actuators may be coupled to, and controlled and monitored by, for example, the controller 166. In some embodiments, flow restrictors 146 and 148 may optionally be coupled to the third flow controller 144 to restrict the flow of the process gas from the third flow controller 144.

In some embodiments, the first flow controller 182 may be configured to direct process gases to the process gas recovery unit 186 and/or the foreline 184 via flow line 192 and/or the second flow controller 142. The second flow controller 142 may be configured to process gases to the gas distribution apparatus 103 and/or the third flow controller 144. The third flow controller 144 may be configured to direct process gases to the process gas recovery unit 186 and/or the foreline 184 through the flow restrictor 146 and/or the gas distribution apparatus 103 through the flow restrictor 148.

In operation of the fast gas exchange unit 101 as described above, to provide a process gas to the gas distribution apparatus 103, a first process gas may be provided to the first flow path 188 by the process gas supply 162. The process gas may be directly provided to the gas distribution apparatus 103, via the first flow controller 182 and second flow controller 142 or, alternatively, the process gas may be provided to the gas distribution apparatus 103 through the flow restrictor 148 via the first flow controller 182, second flow controller 142 and third flow controller 144. The first flow controller 182, second flow controller 142 and third flow controller 144 coupled to the first flow path 188 may be alternately actuated with the first flow controller 178, second flow controller 180 and third flow controller 140 coupled to the second flow path 190 to facilitate providing separate process gases to the gas distribution apparatus 103 (and ultimately, the process chamber 176 in an alternating pattern.

A controller 166 may be provided and coupled to the gas distribution system 100 for controlling the components of the system. For example, the controller 166 may be coupled to one or more of the process gas supplies 162, 164 the fast gas exchange unit 101 or the gas distribution apparatus 103 to facilitate control thereof.

The controller 166 may be any suitable controller and may be the process controller for a process chamber or process tool to which the gas distribution system 100 is coupled, or some other controller. The controller 166 generally includes a central processing unit (CPU) 168, a memory 172, and support circuits 170. The CPU 168 may be one of any form of a general purpose computer processor that can be used in an industrial setting. The support circuits 170 are coupled to the CPU 168 and may comprise cache, clock circuits, input/output subsystems, power supplies, and the like. Software routines 174, such as the methods for operating the gas distribution system 100 described herein, for example with respect to FIGS. 3, 4, and 5, may be stored in the memory 172 of the controller 166. The software routines 174, when executed by the CPU 168, transform the CPU 168 into a specific purpose computer (controller 166). The software routines 174 may also be stored and/or executed by a second controller (not shown) that is located remotely from the controller 166.

Figure 3:
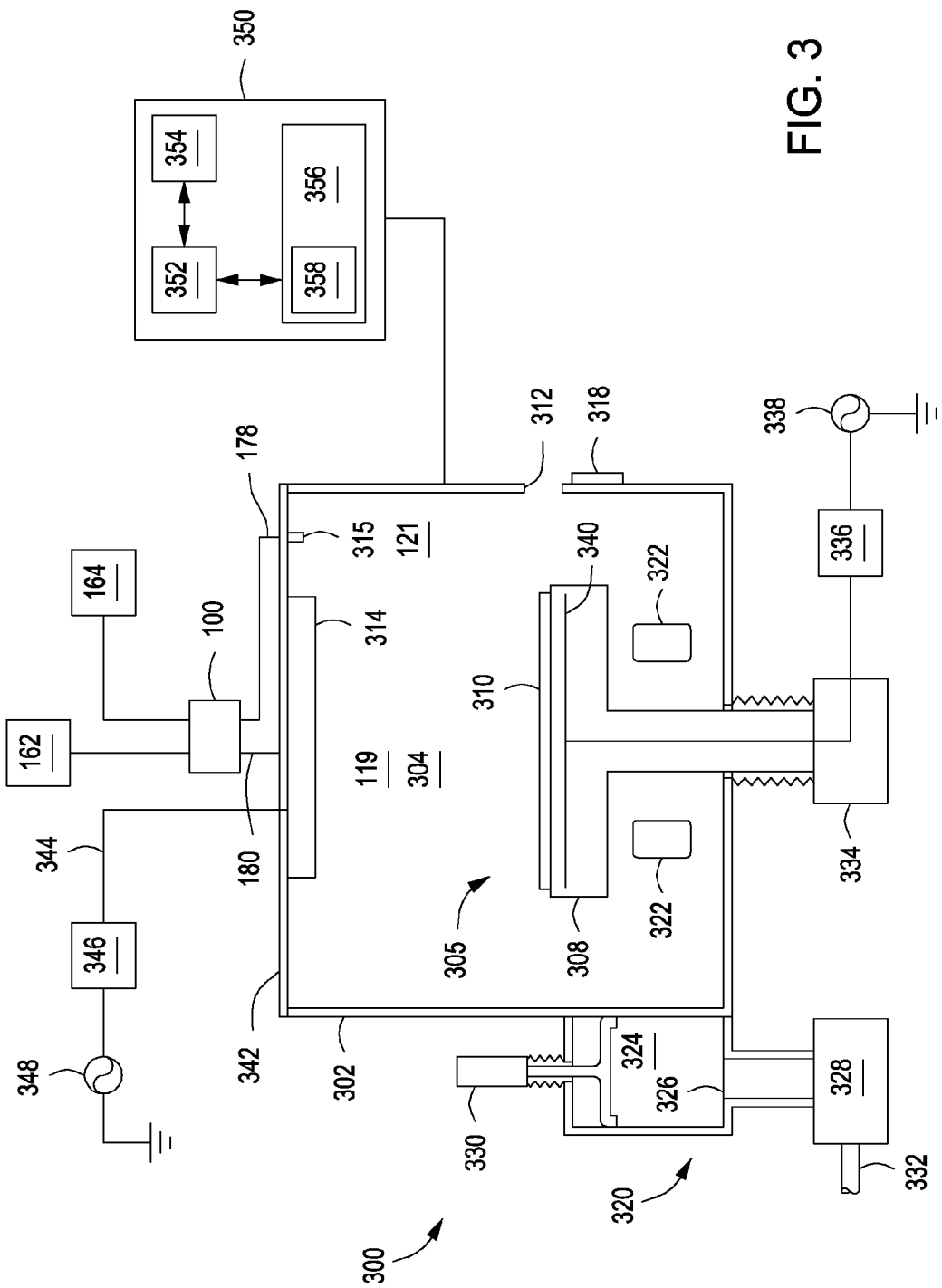
FIG. 3 depicts a process chamber suitable for use with a gas distribution apparatus in accordance with some embodiments of the present invention.

FIG. 3 depicts a process chamber suitable for use with the gas distribution system 100 in accordance with some embodiments of the present invention. The process chamber 300 may comprise a controller 350 and a chamber body 302 having an exhaust system 320 for removing excess process gases, processing by-products, or the like, from the interior of the chamber body 302. Exemplary process chambers may include the DPS®, ENABLER®, ADVANTEDGE™, or other process chambers, available from Applied Materials, Inc. of Santa Clara, Calif. Other suitable process chambers may similarly be used.

The chamber body 302 has an inner volume 305 that may include a processing volume 304. The processing volume 304 may be defined, for example, between a substrate support pedestal 308 disposed within the chamber body 302 for supporting a substrate 310 thereupon during processing and one or more gas inlets, such as a showerhead 314 and/or nozzles 315 provided at desired locations. In some embodiments, the substrate support pedestal 308 may include a mechanism that retains or supports the substrate 310 on the surface of the substrate support pedestal 308, such as an electrostatic chuck, a vacuum chuck, a substrate retaining clamp, or the like (not shown). In some embodiments, the substrate support pedestal 308 may include mechanisms for controlling the substrate temperature (such as heating and/or cooling devices, not shown) and/or for controlling the species flux and/or ion energy proximate the substrate surface.

For example, in some embodiments, the substrate support pedestal 308 may include an RF bias electrode 340. The RF bias electrode 340 may be coupled to one or more bias power sources (one bias power source 338 shown) through one or more respective matching networks (matching network 336 shown). The one or more bias power sources may be capable of producing up to 12,000 W at a frequency of about 2 MHz, or about 13.56 MHz, or about 60 Mhz. In some embodiments, two bias power sources may be provided for coupling RF power through respective matching networks to the RF bias electrode 340 at respective frequencies of about 2 MHz and about 13.56 MHz. In some embodiments, three bias power sources may be provided for coupling RF power through respective matching networks to the RF bias electrode 340 at respective frequencies of about 2 MHz, about 13.56 MHz, and about 60 Mhz. The at least one bias power source may provide either continuous or pulsed power. In some embodiments, the bias power source alternatively may be a DC or pulsed DC source.

The substrate 310 may enter the chamber body 302 via an opening 312 in a wall of the chamber body 302. The opening 312 may be selectively sealed via a slit valve 318, or other mechanism for selectively providing access to the interior of the chamber through the opening 312. The substrate support pedestal 308 may be coupled to a lift mechanism 334 that may control the position of the substrate support pedestal 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support pedestal 308 may be disposed above the opening 312 to provide a symmetrical processing region.

In some embodiments, the one or more gas inlets (e.g., the showerhead 314 and nozzle 315) may provide process gases to one or more gas delivery zones (e.g., first gas delivery zone 119 and second gas delivery zone 121 shown in FIG. 3). The process gases may be provided by one or more process gas supplies (e.g., process gas supplies 162, 164 shown in FIG. 3) via the gas distribution system 100. The inventors have observed that providing the gas distribution system 100 in close proximity to the process chamber 300 may advantageously allow for the gases to reach the gas delivery zones 119, 121 quickly as compared to, for example, providing the gas distribution system 100 in a remote location away from the process chamber 300. Allowing for the gases to reach the gas delivery zones 119, 121 quickly provides precise exposure of a substrate to a desired process for a desired period of time, for example, such as in applications that require rapid switching of process gases, such as the through silicon via applications described above. In some embodiments, the process chamber 300 may utilize capacitively coupled RF power for plasma processing, although the apparatus may also or alternatively use inductive coupling of RF power for plasma processing. For example, the chamber body 302 may have a ceiling 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown). The one or more plasma sources may be capable of producing up to about 5,000 W at a frequency of about 2 MHz and or about 13.56 MHz or high frequency, such as 27 MHz and/or 60 MHz.

The exhaust system 320 generally includes a pumping plenum 324 and one or more conduits that couple the pumping plenum 324 to the inner volume 305 (and generally, the processing volume 304) of the chamber body 302, for example via one or more inlets 322 (two inlets shown in FIG. 3). A vacuum pump 328 may be coupled to the pumping plenum 324 via a pumping port 326 for pumping out the exhaust gases from the chamber body 302. The vacuum pump 328 may be fluidly coupled to an exhaust outlet 332 for routing the exhaust as required to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the chamber body 302 as described above, the controller 350 may be one of any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the chamber body 302 to perform processes of the present invention. The software routine 358 may also be stored and/or executed by a second CPU (not shown) that is remotely located from the hardware being controlled by the CPU 352. Some or all of the method of the present invention may also be performed in hardware. As such, the invention may be implemented in software and executed using a computer system, in hardware as, e.g., an application specific integrated circuit or other type of hardware implementation, or as a combination of software and hardware. The software routine 358 may be executed after the substrate 310 is positioned on the substrate support pedestal 308. The software routine 358, when executed by the CPU 352, transforms the general purpose computer into a specific purpose computer (controller 350) that controls the chamber operation such that the methods disclosed herein are performed.

Thus, embodiments of gas distribution apparatus have been provided herein. In at least some embodiments of the present invention, the inventive gas distribution apparatus may advantageously provide for greater flexibility in etching applications as compared to conventionally utilized gas distribution apparatuses.

While the foregoing is directed to embodiments of the present invention, other and further embodiments of the invention may be devised without departing from the basic scope thereof.

The invention claimed is:

1. A gas distribution apparatus, comprising:
a manifold having a gas inlet to receive a process gas from a fast gas exchange unit, a first gas outlet to provide the process gas to a first gas delivery zone, and a second gas outlet to provide the process gas to a second gas delivery zone;
a plurality of flow restrictors fluidly coupled to one another in parallel, and fluidly coupled to the gas inlet, wherein each of the plurality of flow restrictors are configured to allow at least a portion of a total flow of a process gas through each of the plurality of flow restrictors, wherein the plurality of flow restrictors comprises:
a first set of flow restrictors fluidly coupled to one another in parallel and fluidly coupled only to the first gas outlet; and
a second set of flow restrictors fluidly coupled to one another in parallel and fluidly coupled only to the second gas outlet; and
a plurality of valves each coupled to respective ones of the plurality of flow restrictors, wherein the plurality of valves are configured to be selectively opened to allow the process gas to flow through selective ones of the plurality of flow restrictors to provide a desired percentage of a total flow of the process gas to the respective gas outlets.

2. The gas distribution apparatus of claim 1, wherein the plurality of valves comprise:
a first set of valves respectively coupled to the first set of flow restrictors; and
a second set of valves respectively coupled to the second set of flow restrictors.

3. The gas distribution apparatus of claim 1, wherein the second gas delivery zone is a gas zone of a process chamber, wherein the gas zone is disposed proximate an edge of a substrate support disposed within the process chamber.

4. The gas distribution apparatus of claim 1, wherein each of the first and second sets of flow restrictors comprise:
a first flow restrictor configured to allow about 5% of a total flow of a process gas through the first flow restrictor;
a second flow restrictor configured to allow about 10% of a total flow of a process gas through the first flow restrictor;
a third flow restrictor configured to allow about 20% of a total flow of a process gas through the first flow restrictor;
a fourth flow restrictor configured to allow about 25% of a total flow of a process gas through the first flow restrictor;
a fifth flow restrictor configured to allow about 40% of a total flow of a process gas through the first flow restrictor; and
a sixth flow restrictor configured to allow about 100% of a total flow of a process gas through the first flow restrictor.

5. The gas distribution apparatus of claim 1, wherein each of the plurality of valves comprises a pneumatic actuator and wherein the pneumatic actuator is controlled by a controller.

6. The gas distribution apparatus of claim 1, wherein the first gas delivery zone is a gas zone of a process chamber, wherein the gas zone is disposed proximate a center of a substrate support disposed within the process chamber.

7. The gas distribution apparatus of claim 1, wherein the manifold and the fast gas exchange unit are disposed in a housing.

8. The gas distribution apparatus of claim 1, wherein the fast gas exchange unit comprises:
a plurality of inlets respectively coupled to a plurality of gas sources;
an outlet coupled to the inlet of the manifold;
a first flow path having a first plurality of flow controllers; and
a second flow path having a second plurality of flow controllers, wherein selective actuation of the first plurality of flow controllers and the second plurality of flow controllers provides a flow of a process gases from one of the plurality of gas sources to the outlet.

9. The gas distribution apparatus of claim 8, wherein each of the first plurality of flow controllers and the second plurality of flow controllers comprise:
a first flow controller configured to allow a flow of process gas to the outlet or to a foreline coupled to the fast gas exchange unit;
a second flow controller coupled to the first flow controller and configured to allow a flow of process gas to the outlet; and
a third flow controller coupled to the second flow controller and configured to allow a flow of process gas to the outlet through a first flow restrictor or to the foreline coupled to the fast gas exchange unit through a second flow restrictor.

10. The gas distribution apparatus of claim 9, wherein each of the first plurality of flow controllers and the second plurality of flow controllers further comprise a fourth flow controller coupled to the third flow controller and configured to allow a flow of process gas to the foreline coupled to the fast gas exchange unit or to a process gas recovery unit to recycle the process gas.

11. A gas distribution system, comprising:
a housing having a gas distribution apparatus and a fast gas exchange unit disposed within the housing, the fast gas exchange unit having:
a plurality of inlets respectively coupled to a plurality of gas sources;
an outlet;
a first flow path having a first plurality of flow controllers; and
a second flow path having a second plurality of flow controllers, wherein selective actuation of the first plurality of flow controllers and the second plurality of flow controllers provides a flow of a process gases from one of the plurality of gas sources to the outlet, and wherein the gas distribution apparatus comprises:
a manifold having a gas inlet to receive a process gas from the outlet of the fast gas exchange unit, a first gas outlet to provide the process gas to a first gas delivery zone, and a second gas outlet to provide the process gas to a second gas delivery zone;
a plurality of flow restrictors fluidly coupled to one another in parallel, and fluidly coupled to the gas inlet, wherein each of the plurality of flow restrictors are configured to allow at least a portion of a total flow of a process gas through each of the plurality of flow restrictors, wherein the plurality of flow restrictors comprises:
a first set of flow restrictors fluidly coupled to one another in parallel and fluidly coupled only to the first gas outlet; and
a second set of flow restrictors fluidly coupled to one another in parallel and fluidly coupled only to the second gas outlet; and
a plurality of valves each coupled to respective ones of the plurality of flow restrictors, wherein the plurality of valves are configured to be selectively opened to allow the process gas to flow through selective ones of the plurality of flow restrictors to provide a desired percentage of a total flow of the process gas to the respective gas outlets.

12. The gas distribution system of claim 11, wherein the plurality of valves comprise:
a first set of valves respectively coupled to the first set of flow restrictors; and
a second set of valves respectively coupled to the second set of flow restrictors.

13. The gas distribution system of claim 11, wherein the second gas delivery zone is a gas zone of a process chamber, wherein the gas zone is disposed proximate an edge of a substrate support disposed within the process chamber.

14. The gas distribution system of claim 11, wherein each of the first and second sets of flow restrictors comprise:
a first flow restrictor configured to allow about 5% of a total flow of a process gas through the first flow restrictor;
a second flow restrictor configured to allow about 10% of a total flow of a process gas through the first flow restrictor;
a third flow restrictor configured to allow about 20% of a total flow of a process gas through the first flow restrictor;
a fourth flow restrictor configured to allow about 25% of a total flow of a process gas through the first flow restrictor;
a fifth flow restrictor configured to allow about 40% of a total flow of a process gas through the first flow restrictor; and
a sixth flow restrictor configured to allow about 100% of a total flow of a process gas through the first flow restrictor.

15. The gas distribution system of claim 11, wherein the first gas delivery zone is a gas zone of a process chamber, wherein the gas zone is disposed proximate a center of a substrate support disposed within the process chamber.

16. The gas distribution system of claim 11, wherein each of the first plurality of flow controllers and the second plurality of flow controllers comprise:
a first flow controller configured to allow a flow of process gas to the outlet or to a foreline coupled to the fast gas exchange unit;
a second flow controller coupled to the first flow controller and configured to allow a flow of process gas to the outlet; and
a third flow controller coupled to the second flow controller and configured to allow a flow of process gas to the outlet through a first flow restrictor or to the foreline coupled to the fast gas exchange unit through a second flow restrictor.

17. The gas distribution system of claim 16, wherein each of the first plurality of flow controllers and the second plurality of flow controllers further comprise a fourth flow controller coupled to the third flow controller and configured to allow a flow of process gas to the foreline coupled to the fast gas exchange unit or to a process gas recovery unit to recycle the process gas.

18. A gas distribution system, comprising:
a housing;
a fast gas exchange unit disposed within the housing, wherein the fast gas exchange unit comprises:
a plurality of inlets respectively coupled to a plurality of gas sources;
an outlet;
a first flow path having a first plurality of flow controllers; and
a second flow path having a second plurality of flow controllers, wherein selective actuation of the first plurality of flow controllers and the second plurality of flow controllers provides a flow of a process gases from one of the plurality of gas sources to the outlet;
a gas distribution apparatus disposed within the housing, wherein the gas distribution apparatus comprises:
a manifold having a gas inlet to receive a process gas from the outlet of the fast gas exchange unit, a first gas outlet to provide the process gas to a first gas delivery zone, and a second gas outlet to provide the process gas to a second gas delivery zone;
a plurality of flow restrictors fluidly coupled to one another in parallel, and fluidly coupled to the gas inlet, wherein each of the plurality of flow restrictors are configured to allow at least a portion of a total flow of a process gas through each of the plurality of flow restrictors, wherein the plurality of flow restrictors comprise a first set of flow restrictors fluidly coupled to one another in parallel and fluidly coupled only to the first gas outlet, and a second set of flow restrictors fluidly coupled to one another in parallel and fluidly coupled to only the second gas outlet, and wherein the first gas delivery zone and the second gas delivery zone are gas zones of a process chamber; and
a plurality of valves each coupled to respective ones of the plurality of flow restrictors, wherein the plurality of valves are configured to be selectively opened to allow the process gas to flow through selective ones of the plurality of flow restrictors to provide a desired percentage of a total flow of the process gas to the respective gas outlets.

* * * * *